(12) United States Patent
Tyagi et al.

(10) Patent No.: US 11,798,603 B2
(45) Date of Patent: Oct. 24, 2023

(54) CIRCUIT FOR GENERATING AND TRIMMING PHASES FOR MEMORY CELL READ OPERATIONS

(71) Applicants: STMICROELECTRONICS S.r.l., Agrate Brianza (IT); STMicroelectronics International N.V., Geneva (CH)

(72) Inventors: Vivek Tyagi, Ghaziabad (IN); Vikas Rana, Noida (IN); Chantal Auricchio, Cassina de'Pecchi (IT); Laura Capecchi, Vedano al Lambro (IT)

(73) Assignees: STMICROELECTRONICS S.r.l., Agrate Brianza (IT); STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/175,375

(22) Filed: Feb. 27, 2023

(65) Prior Publication Data
US 2023/0206971 A1    Jun. 29, 2023

Related U.S. Application Data

(63) Continuation of application No. 17/542,203, filed on Dec. 3, 2021, now Pat. No. 11,615,823, which is a (Continued)

(51) Int. Cl.
*G11C 7/12* (2006.01)
*G11C 7/06* (2006.01)
(Continued)

(52) U.S. Cl.
CPC .............. *G11C 7/12* (2013.01); *G11C 7/065* (2013.01); *G11C 7/222* (2013.01); *G11C 11/4091* (2013.01); *G11C 11/4094* (2013.01)

(58) Field of Classification Search
CPC .......... G11C 7/12; G11C 7/065; G11C 7/222; G11C 11/4091; G11C 11/4094
See application file for complete search history.

(56) References Cited

U.S. PATENT DOCUMENTS 6,470,467 B2    10/2002    Tomishima et al.
6,492,852 B2    12/2002    Fiscus
(Continued)

FOREIGN PATENT DOCUMENTS

KR    10-2008-0006888 A    1/2008

OTHER PUBLICATIONS

Choi et al., "A Multiplying Delay-Locked Loop For A Self-Adjustable Clock Generator," Technical Report No. UCB/EECS-2017-108, Electrical Engineering and Computer Sciences University of California at Berkeley, May 16, 2017, 30 pages.

*Primary Examiner* — Xiaochun L Chen
(74) *Attorney, Agent, or Firm* — Seed IP Law Group LLP

(57) ABSTRACT

A read signal generator generates read signals to control read operations of a memory array. The read signal generator can be selectively controlled to generate an oscillating signal having a period that corresponds to a feature one of the read signals. The oscillating signal is passed to a frequency divider that divides the oscillating signal and provides the divided oscillating signal to an output pad. The frequency of the oscillating signal can be measured at the output pad. The frequency of the oscillating signal, and the duration of the read signal feature can be calculated from the frequency of the oscillating signal. The read signal feature can then be adjusted if needed.

20 Claims, 7 Drawing Sheets

Related U.S. Application Data continuation of application No. 17/010,704, filed on Sep. 2, 2020, now Pat. No. 11,205,462.

(60) Provisional application No. 62/899,005, filed on Sep. 11, 2019.

(51) Int. Cl.
*G11C 11/4094* (2006.01)
*G11C 11/4091* (2006.01)
*G11C 7/22* (2006.01)

(56) References Cited

U.S. PATENT DOCUMENTS

| | | |
|---|---|---|
| 6,671,787 B2 | 12/2003 | Kanda et al. |
| 7,518,938 B2 | 4/2009 | Yoo |
| 9,304,579 B2 | 4/2016 | Ware et al. |
| 10,846,229 B1 * | 11/2020 | Choi ................. G06F 13/1673 |
| 2001/0039602 A1 | 11/2001 | Kanda et al. |

* cited by examiner

100

700

702

GENERATE A FIRST OSCILLATING SIGNAL WITH A READ SIGNAL GENERATOR OF AN INTEGRATED CIRCUIT

704

GENERATE A FIRST DIVIDED OSCILLATING SIGNAL FROM THE FIRST OSCILLATING SIGNAL WITH A FREQUENCY DIVIDER OF THE INTEGRATED CIRCUIT

706

OUTPUT THE FIRST DIVIDED OSCILLATING SIGNAL ON AN OUTPUT PAD OF THE INTEGRATED CIRCUIT

Figure 7

CIRCUIT FOR GENERATING AND TRIMMING PHASES FOR MEMORY CELL READ OPERATIONS

BACKGROUND

Technical Field

The present disclosure relates to the field of integrated circuits. The present disclosure relates more particularly to memory cell read operations.

Description of the Related Art

Many integrated circuits include memory cells that store data. The data stored by the memory cells can include executable software instructions, images, video files, audio files, and documents.

The memory cells are typically arranged in an array of rows and columns. The memory cells in each row are connected together by a respective wordline. The memory cells in each column are connected together by a respective bitline.

Sense amplifiers are typically coupled to the bitlines. The sense amplifiers assist in reading data from the memory cells. In many cases, a complex set of signals are generated to control the timing of read operations performed by the sense amplifiers.

Engineers and scientists continually seek to improve the speed with which data can be read from memory cells. The number of read cycles that can be performed per second is based, in part, on the frequency of a read clock signal. The higher the frequency of the read clock signal, the higher the number of read operations that can be performed per second.

However, as the frequency of read clock signals increases, the window of time for performing an individual read operation decreases. This can be problematic because, as mentioned above, in some cases read operations are governed by a complex set of signals based on the read clock signal. The signals have specific timings and relationships with each other. Some of the features of the signals may have windows of time that are far shorter than the period of an individual clock cycle.

In some cases, the timings of the various read signals can be affected by variations in process during fabrication of the integrated circuit. For example, the circuit components that generate some of the signals can have signal propagation delays that will vary somewhat depending on variations in conditions during fabrication. Such signal propagation delays can result in improper timing of the various read signals, especially those with very small windows of time. If the timings of the various signals do not fall within selected tolerances, then read operations may fail.

These problems are amplified by the fact that it can be difficult to measure the timings of the signals during testing and qualification of batches of the integrated circuits. Typically, testing is done by an external testing circuit that connects to one or more output pads of the integrated circuit. However, these output pads have relatively large areas and correspondingly large capacitances. These large capacitances may result in the time required to sufficiently charge and discharge the output pads being greater than the expected duration of a signal feature to be measured, rendering an accurate measurement impossible. For example, when trying to measure a signal feature with an expected length of less than 10 ns, the output pad may not sufficiently charge and discharge in less than 50 ns, resulting in an inability to accurately measure the timing of the signal future.

BRIEF SUMMARY

One embodiment is an integrated circuit having an array of memory cells. The integrated circuit includes a read signal generator that generates various read signals for controlling read operations of the memory cells. The read signal generator includes circuitry that selectively generates an oscillating signal having a period that is representative of the duration of a particular feature of one of the read signals. The integrated circuit also includes a frequency divider that receives the oscillating signal from the read signal generator and outputs a divided oscillating signal having a frequency that is reduced relative to the oscillating signal based on a frequency division ratio. The frequency divider passes the divided oscillating signal to an output pad of the integrated circuit.

During testing of the timings of the various read signals, a testing circuit interfaces with the output pad and measures the period of the divided oscillating signal. The period of the divided oscillating signal corresponds to a duration of the signal feature multiplied by the frequency division ratio. The duration of the signal feature can be obtained by dividing the period of the divided oscillating signal by the division ratio.

Accordingly, the integrated circuit advantageously provides a way to measure the duration of read signal features that are shorter than the charging and discharging times of the output pads of the integrated circuit. The oscillating signal and the corresponding divided oscillating signal can be selectively generated during testing.

Additionally, in one embodiment, the read signal generator includes circuitry that enables trimming of the signal features. For example, if during testing a signal feature is measured to be too long or too short, the signal feature can be trimmed by adjusting one or more control parameters of the read signal generator.

Embodiments of the present disclosure overcome some of the drawbacks of traditional integrated circuits by enabling the accurate measurement of read signal features having durations that are less than the charging or discharging times of output pads. Additionally, one or more embodiments of the present disclosure enable trimming of read signal features if measurements indicate that they are too long or too short.

BRIEF DESCRIPTION OF THE SEVERAL VIEWS OF THE DRAWINGS

FIG. 7 is a flow diagram of a process for operating an integrated circuit, according to an embodiment.

DETAILED DESCRIPTION

Figure 1:
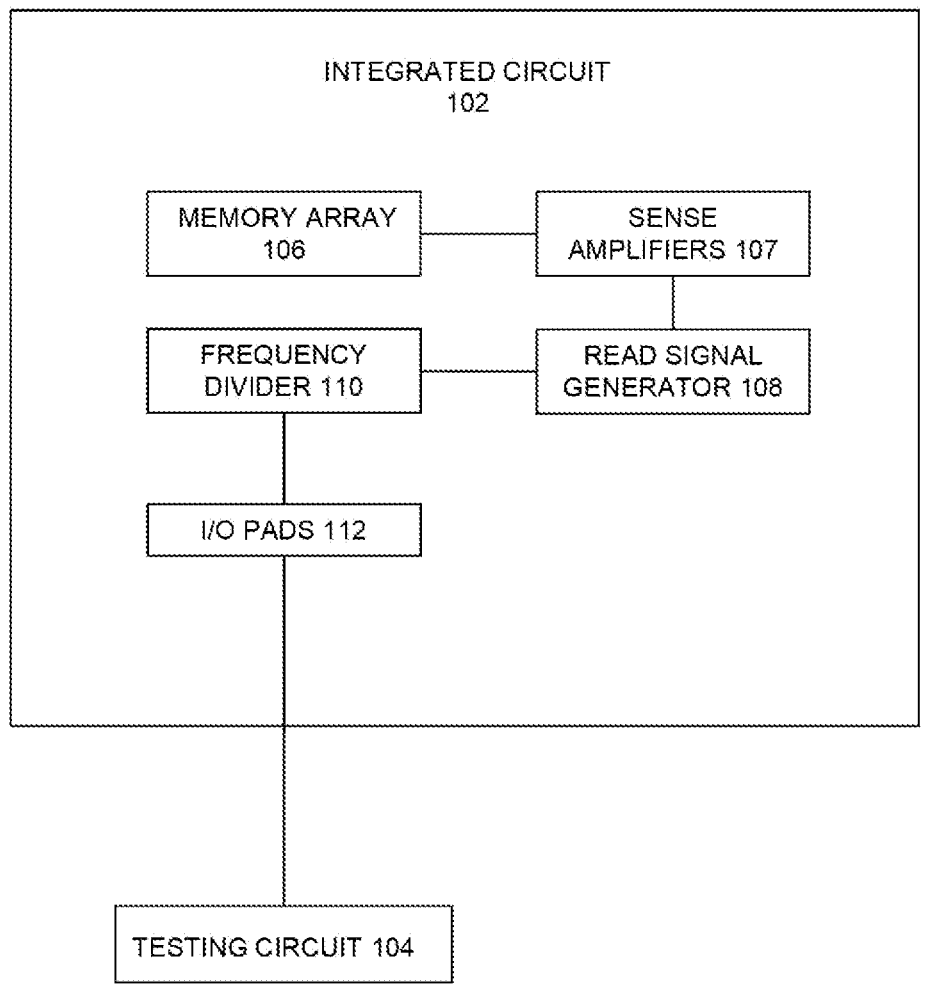
FIG. 1 is a block diagram of an integrated circuit testing system, according to one embodiment.

FIG. 1 is a block diagram of an integrated circuit testing system 100, according to one embodiment. The integrated circuit testing system 100 includes an integrated circuit 102 and a testing circuit 104. The testing circuit 104 tests or measures various aspects of the integrated circuit 102.

In one embodiment, the integrated circuit 102 includes a memory array 106, a read signal generator 108, a frequency divider 110, and an output pad 112. The read signal generator 108, the frequency divider 110, and the output pad 112 cooperate to enable the testing circuit 104 to accurately measure signal features that have very short durations. Those of skill in the art will recognize, in light of the present disclosure, that the integrated circuit 102 can include many other components than those shown in FIG. 1.

The memory array 106 includes a plurality of memory cells. Each individual memory cell can store one or more bits of data. The data can be read from the memory cells.

The memory array 106 can include nonvolatile memory cells. The nonvolatile memory cells can include memory cells to which data can be written multiple times or only a single time. The nonvolatile memory cells can include phase change memory cells, read only memory (ROM) cells, flash memory cells, magnetoresistive random access memory cells (MRAM), or other types of nonvolatile memory cells.

The memory array 106 can include volatile memory cells that need continuous or intermittent refreshing in order to retain stored data. The volatile memory cells can include dynamic random-access memory (DRAM), static random-access memory (SRAM), or other types of volatile memory cells.

The memory cells of the memory array 106 are organized in rows and columns. Each row of memory cells is connected to a respective wordline. Each column of memory cells is connected to a respective bitline. The bitlines and wordlines facilitate reading data from the memory cells and writing data to the memory cells.

The sense amplifiers 107 are connected to the memory array 106. In particular, each sense amplifier 107 can be selectively connected to a bitline of the memory array 106. During a read operation, each sense amplifier precharges a bitline and then evaluates a data value from a memory cell connected to the bitline.

The read signal generator 108 is coupled to and controls the operation of the sense amplifiers 107. The read signal generator 108 generates a plurality of read signals. The read signal generator 108 provides the read signals to the sense amplifiers 107. The read signals control the sense amplifiers 107 during read operations.

The read signal generator 108 generates the read signals based on a read clock signal. The timings of the various read signals are based, in part, on the rising and falling edges of the read clock signal. Additionally, the frequency of the read clock signal determines the number of read cycles per second that can be performed. The read clock signal also controls, in part, the timing and features of the read signals.

The read clock signal is generated by an oscillator. The oscillator can be part of the read signal generator 108. Alternatively, the oscillator can be external to the read signal generator 108. The oscillator can include a crystal oscillator, a voltage-controlled oscillator, a voltage-controlled crystal oscillator, or other oscillators suitable for generating clock signals.

In one embodiment, the read signal generator 108 can generate read signals including a precharge signal and an evaluation signal. The various forms and timings of the signals are based on the read clock signal and signal generation circuitry. The timings of these signals control the read operations of the memory array 106. The sense amplifiers can generate a stop signal and provide the stop signal to the read signal generator.

In one embodiment, the read signal generator 108 passes the precharge signal and the evaluation signal to the sense amplifiers 107. During the read operation, the precharge signal causes each sense amplifier to precharge a respective bitline. After the sense amplifiers 107 have precharge the bitlines, the evaluation signal causes each sense amplifier 107 to evaluate the value of data stored in a memory cell coupled to the respective bitline. The sense amplifier can generate a stop signal and provide the stop signal to the read signal generator, based, in part, on the evaluation signal and the precharge signal. The read signal generator can 108 can generate the evaluation signal and the precharge signal, based, in part, on the stop signal.

In one embodiment, the precharging and evaluation operations occur within a single cycle of the read clock signal. The timings of the precharge and evaluation signals can be quite precise. For example, if the period of a single clock cycle is on the order of 25 ns, the precharge signal is timed to go low within about 8 ns after the rising edge of the read clock signal. The evaluation signal is timed to go high about 2.5 ns after the precharge signal goes low.

These timings of 8 ns and 2.5 ns represent short windows of time compared to the period of the clock signal. If the timings of the read and evaluation signals do not fit within selected tolerances, it is possible that read operations will not be completed properly.

In order to ensure that the timings of the various read signals fit within tolerances, the testing circuit 104 measures the timings of the read signals. The testing circuit 104 connects to I/O pads 112 of the integrated circuit 102. The testing circuit 104 measures the timings of the read signals via the I/O pads 112. The testing circuit 104 does not measure the timings of the read signals directly. This is because the relatively large surface areas of the I/O pads 112 results in the I/O pads 112 having capacitances that are too large to charge and discharge within the short time frames of the various features and timings of the read signals.

To overcome the technical hurdles posed by the short timing windows of the read signals and the large capacitances of the I/O pads 112, the read signal generator 108 and the frequency divider 110 cooperate to output adjusted signals that can be measured at the I/O pads 112 and from which the durations of the features of the read signals can be derived. In particular, during testing, the read signal generator 108 generates oscillating signals based on features of the read signals. The oscillating signals are passed to the frequency divider 110 and the frequency divider 110 generates divided oscillating signals by dividing the frequencies of the oscillating signals. The divided oscillating signals are then output to the I/O pads 112. The testing circuit 104 measures the frequencies of the divided oscillating signals and computes the frequencies of the oscillating signals based on the division ratio of the frequency divider 110 and the measured frequencies of the divided oscillating signals.

During testing, the read signal generator 108 can be selectively controlled to generate oscillating signals that have periods corresponding to particular features of the read signals. The read signal generator 108 includes oscillator loops that can be selectively enabled for testing purposes.

When an oscillator loop is selectively enabled during testing, the oscillator loop outputs an oscillating signal having a period corresponding to the duration of a particular feature of one of the read signals.

In one embodiment, the read signal generator 108 includes an oscillator loop that can be selectively enabled for measuring the delay between the rising edge of the read clock signal and the falling edge of the precharge signal. When this oscillator loop is enabled, the oscillator loop generates an oscillating signal that has a period corresponding to the delay between the rising edge of the read clock signal and the falling edge of the precharge signal. For example, if the precharge delay is about 8 ns, then the corresponding oscillating signal will have a period of about 8 ns.

In one embodiment, the read signal generator 108 includes an oscillator loop that can be selectively enabled for measuring the delay between the falling edge of the precharge signal and the rising edge of the evaluation signal. When this oscillator loop is enabled, the oscillator loop generates an oscillating signal that has a period corresponding to the delay between the falling edge of the precharge signal and the rising edge of the evaluation signal. For example, if the evaluation delay is about 2.5 ns, then the oscillating signal has a period of about 2.5 ns.

In one embodiment, the read signal generator 108 includes an oscillator loop that can be selectively enabled for measuring the total delay between the rising edge of the read clock signal and the rising edge of the evaluation signal. This delay corresponds to the sum of the precharge delay and the evaluation delay. When this oscillator loop is enabled, the oscillator loop generates an oscillating signal that has a period corresponding to the delay between the rising edge of the read clock signal and the rising edge of the evaluation signal. If the precharge delay is about 8 ns and the evaluation delay is about 2.5 ns, then the oscillating signal has a period of about 10.5 ns.

In one embodiment, the frequency divider 110 receives the oscillating signals from the read signal generator 108. The frequency divider 110 has a frequency division ratio selected to ensure that the resulting adjusted oscillating signal has a period sufficiently long to be measured at the I/O pads 112. The division ratio is selected to ensure an oscillation period that is longer than the charge and discharge time of the I/O pads 112.

In one embodiment, the division ratio of the frequency divider 110 is 16. This means that when an oscillating signal is provided to the frequency divider 110, the frequency divider 110 will output a divided oscillating signal with a frequency that is 1/16th the frequency of the oscillating signal. Accordingly, the period of the adjusted oscillating signal is 16 times longer than the period of the oscillating signal.

The testing circuit 104 measures the divided oscillating signal at the I/O pads 112. In one example, the testing circuit 104 measures the frequency of the divided oscillating signal and then calculates the frequency of the corresponding oscillating signal by multiplying the frequency of the adjusted oscillating signal by the division ratio of the frequency divider 110. The testing circuit 104 can then calculate the duration or length of the corresponding feature of the read signals by calculating the period of the oscillating signal. In another example, the testing circuit measures the period of the divided oscillating signal and calculates the period of the oscillating signal based on the division ratio of the frequency divider 110. The period of the oscillating signal corresponds to the duration of the signal future.

In one embodiment, the testing circuit 104 first measures or computes the precharge delay by enabling the precharge oscillator loop. The testing circuit 104 then measures the evaluation delay by enabling an oscillator loop that includes both the precharge delay and the evaluation delay. In this case, the evaluation delay is computed by subtracting the precharge delay from the sum of the precharge and oscillation delays.

In one embodiment, the testing circuit 104 is able to trim or adjust aspects of the read signals based on the measurements of the features of the read signals. The read signal generator 108 includes circuitry that enables features of the read signals to be lengthened or reduced. If the testing circuit 108 determines that measured features of the read signals do not fit within selected tolerances, the testing circuit 108 can cause the read signal generator 108 to lengthen or shorten features of the read signals. The read signal generator 108 can then adjust the features of the read signals responsive to control signals from the testing circuit 104.

In one embodiment, the read signal generator 108 can utilize capacitors to introduce timing delays, such as the precharge delay and evaluation delay. The delays can be based, at least in part, on the time it takes to charge or discharge these capacitors. The capacitors can be charged or discharged based on voltage controlled current sources. The charge and discharge times of the capacitors can be adjusted by applying control signals to the voltage controlled current sources. Adjusting the charge and discharge times of the capacitors will adjust the delay times in the read signals.

Figure 2:
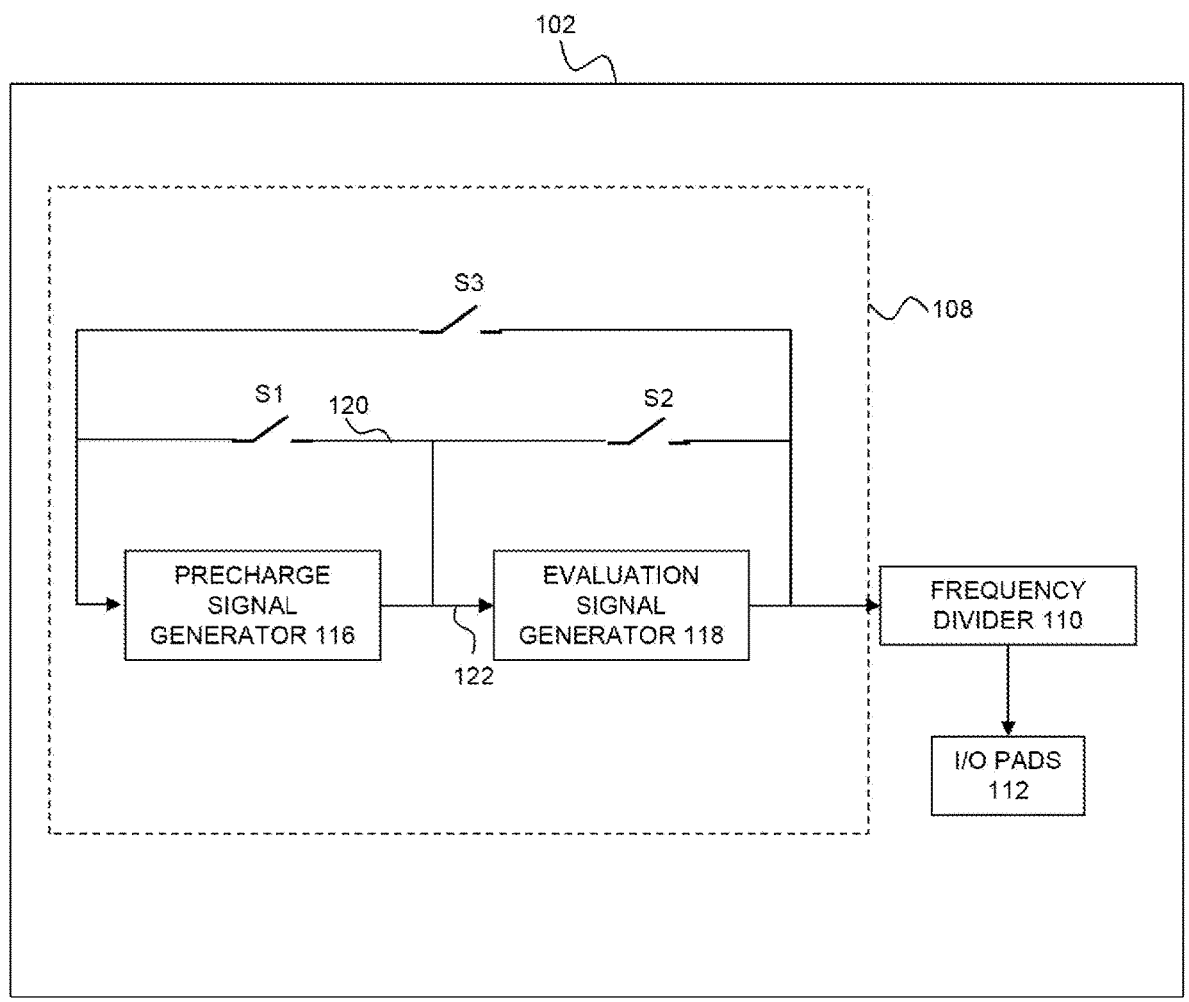
FIG. 2 is a block diagram of an integrated circuit, according to one embodiment.

FIG. 2 is a block diagram of the integrated circuit 102, according to one embodiment. The integrated circuit 102 includes a read signal generator 108, a frequency divider 110, and an output pad 112. FIG. 2 does not illustrate other components of the integrated circuit 102, including the memory array 106 and the sense amplifiers 107.

In one embodiment, the read signal generator 108 includes a precharge signal generator 116 and an evaluation signal generator 118. During normal operation of the integrated circuit 102, the precharge signal generator 116 generates a precharge signal including a precharge delay for timing the precharging of bitlines. During normal operation of the integrated circuit 102, the evaluation signal generator 118 generates an evaluation signal for evaluating data values stored in memory cells during a read operation. The evaluation signal includes an evaluation delay for timing the evaluation of data values stored in memory cells during the read operation.

The read signal generator includes switches S1, S2, and S3 for enabling the selective testing of the precharge delay, the evaluation delay, and the sum of the precharge delay and the evaluation delay. The read signal generator 108 also includes a precharge delay oscillator loop 120 and an evaluation delay oscillator loop 122. The precharge delay oscillator loop 120 and the evaluation delay oscillator loop 122 are utilized to test and adjust the precharge delay and the evaluation delay. During normal operation of the integrated circuit 102, the precharge delay oscillator loop 120 and the evaluation delay oscillator loop 122 are not utilized.

The precharge delay oscillator loop 120 is enabled by enabling the switches S1 and S2, and by disabling the switch S3. The precharge oscillator loop 120 bypasses the evaluation signal generator by enabling the switch S2. During testing of the read signals, the testing circuit 104 connects to the I/O pads 112. The testing circuit inputs a command that enable (close) the switches S1 and S2 and to disable (open) the switch S3. The oscillator loop 120 generates an oscillating signal that has a period that corresponds to the precharge delay. The precharge delay oscillating signal is passed to the frequency divider 110. As described previously, the frequency divider 110 generates a divided oscillating signal by dividing the precharge delay oscillating signal in accordance with a division factor. The divided oscillating signal is passed to the I/O pads 112. The testing circuit 104 analyzes the divided oscillating signal to determine the value of the precharge delay.

The evaluation delay oscillator loop 122 is enabled by enabling the switch S2 and by disabling the switches S1 and S3. During testing of the read signals, the testing circuit connects to the I/O pads 112. The testing circuit inputs a command that enables the switch S2 and disables the switches S1 and S3. The evaluation delay oscillating signal is passed to the frequency divider 110. As described previously, the frequency divider 110 generates a divided oscillating signal by dividing the oscillating signal in accordance with a division factor. The divided oscillating signal is passed to the I/O pads 112 the testing circuit analyzes the divided oscillating signal to determine the value of the evaluation delay.

In one embodiment, the evaluation delay oscillator loop 122 can include both the evaluation delay and the precharge delay. In this case, switch S3 is enabled and switches S1 and S2 are disabled and the evaluation delay oscillator loop 122 generates an oscillating signal that has a period that corresponds to the sum of the precharge delay and the evaluation delay. The evaluation delay oscillating signal is passed to the frequency divider 110. As described previously, the frequency divider 110 generates a divided oscillating signal by dividing the oscillating signal in accordance with a division factor. The divided oscillating signal is passed to the I/O pads 112 the testing circuit analyzes the divided oscillating signal to determine the value of the evaluation delay. The testing circuit 104 can determine the evaluation delay by subtracting the precharge delay from the sum of the evaluation delay and the precharge delay. Alternatively, this precharge delay can be calculated by measuring the evaluation delay, the sum of the evaluation delay and the precharge delay, and subtracting the evaluation delay from the sum of the evaluation delay and the precharge delay.

In one embodiment, the precharge oscillator loop 120 and the evaluation oscillator loop 122 cannot simultaneously be enabled. The integrated circuit 102 can include control circuitry that prevents the simultaneous enabling the precharge oscillator loop 120 and evaluation oscillator loop 122. The control circuitry can also prevent the enabling of the precharge oscillator loop 120 and the evaluation oscillator loop 122 during standard operation of the integrated circuit 102.

In one embodiment, the read signal generator 108 can include a fourth switch coupled immediately before or immediately after the evaluation signal generator 118. The fourth switch can be disabled any time the evaluation delay is not intended to be part of an oscillator signal provided to the frequency divider 110. A fifth switch can also be provided so that there are switched both immediately before and after the evaluation signal generator 118.

While FIG. 2 shows switches S1-S3 for enabling the precharge of evaluation oscillator loops, other types of circuitry can be used for selectively enabling and disabling the precharge and evaluation oscillator loops. For example, the precharge and evaluation oscillator loops 120, 122 can include various arrangements of logic gates and control signal paths for enabling and disabling the precharge and evaluation oscillator loops 120, 122.

Figure 3:
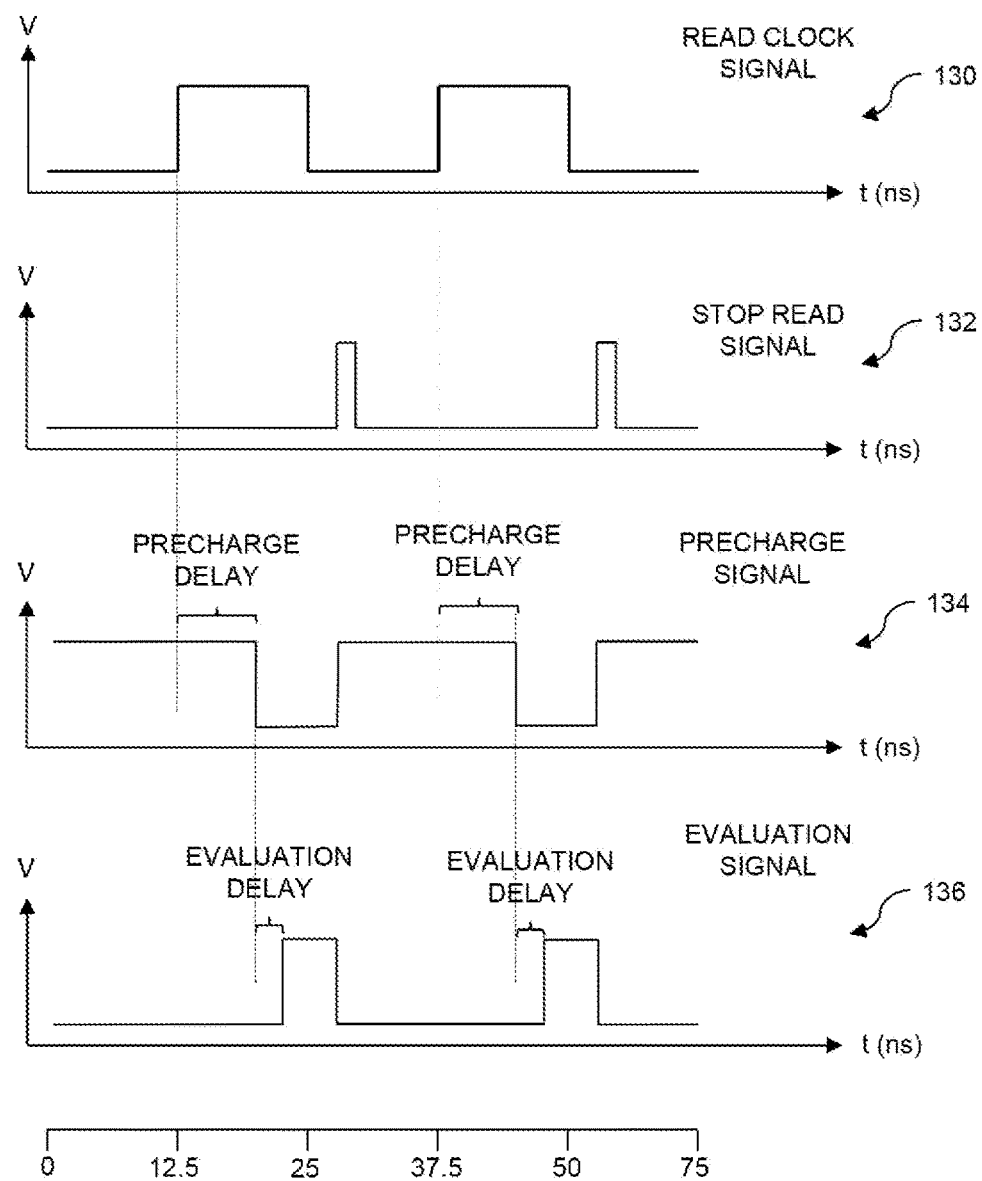
FIG. 3 illustrates a plurality of graphs representing various read signals for controlling read operations of memory cells.

FIG. 3 illustrates a plurality of graphs representing various read signals for controlling read operations of memory cells. In particular, FIG. 3 illustrates a graph 130 for a read clock signal, a graph 132 for a stop read signal, a graph 134 for a precharge signal, and a graph 136 for an evaluation signal. The signals cooperate to collectively control the timing of read operations.

The read clock signal determines the frequency of read operations. All of the other read signals are based, at least in part, on the read clock signal. The read clock signal can be generated by an oscillator. The oscillator can be part of the read signal generator 108. Alternatively, the oscillator that generates the read clock signal can be external to the read signal generator 108.

In the example of FIG. 3, the read clock signal has a frequency of 40 MHz and a corresponding period of 25 ns. The read clock signal transitions between a low logic level and a high logic level in a square wave. While the transitions between logic states are shown as straight lines, in practice there is a finite slope in the transitions between the high and low logic states. Those of skill in the art will recognize, in light of the present disclosure, that the read clock signal can have a frequency other than that shown in FIG. 3 without departing from the scope of the present disclosure.

In one embodiment, the read signals include the stop read signal shown in the graph 132. The sense amplifier generates the stop read signal once the read data is available on a data out bus. The stop read signal marks the stop of an evaluation period during which the data stored in selective memory cells is evaluated by the sense amplifiers 107. The sense amplifier 107 generates the stop read signal and disconnects from bitlines when a memory read operation is completed. The read signal generator 108 receives the stop read signal. The precharge signal goes high response to the stop read signal so the next memory read operation can be started.

In one embodiment, the precharge signal causes the sense amplifiers 107 to precharge the bitlines. The precharging of the bitlines prepares the bitlines for a read operation. When the precharge signal is at a high logic level, the sense amplifiers 107 precharge the bitlines.

In one embodiment, the evaluation signal causes the sense amplifiers 107 to read the data values from selective memory cells via the bitlines. The evaluation period of the read operation occurs while the evaluation signal is at a high logic level. The evaluation period of the read operation occurs after the bitlines have been precharged. The evaluation period rise edge begins following a precharge delay after the precharge signal goes low. The falling edge of precharge signal triggers the evaluation signal generator, which generates the rising edge of evaluation signal only after finite evaluation delay. The read signal generator 108 generates the evaluation signal.

The features of the precharge signal are based, in part, on the read clock signal and the stop signal. The rising edge of the stop signal, i.e. when the stop signal transitions from a low logic value to a high logic value, causes the precharge signal to go from a low logic value to a high logic value. The rising edge of the read clock signal causes the precharge signal to transition from a high logic level to a low logic level after a finite delay. Accordingly, the precharge signal transitions between logic states responsive to transitions in the stop read signal and the read clock signal. Also, the rising edge of the read clock signal causes the precharge signal to go high for the first read operation when the stop read signal is not yet present.

The precharge signal includes a precharge delay. The read signal generator 108 includes circuitry that causes a delay between the rising edge of the read clock signal and the falling edge of the precharge signal. Thus, the precharge signal does not immediately transition from high to low on the rising edge of the read clock signal. Rather, the precharge signal transitions from high to low after the precharge delay.

The precharge delay is a timing feature of the precharge signal. Read operations may depend, in part, on the precharge delay falling within a selected tolerance. In the example of FIG. 3, the precharge delay has a value of about 8 ns. The selected tolerance range is, in one embodiment, 8 ns±0.5 ns.

The features of the evaluation signal are based, in part, on the read clock signal and the precharge signal. The falling edge of the precharge signal causes the evaluation signal to transition from a low logic value to a high logic value. The rising edge of the stop read signal causes the evaluation signal to go from a high logic value to a low logic value. Accordingly, the evaluation signal transitions between logic levels responsive to transitions in the precharge signal and the stop read signal.

The evaluation signal includes an evaluation delay. The read signal generator 108 includes circuitry that causes a delay between the falling edge of the precharge signal and the rising edge of the evaluation signal. Thus, the evaluation signal does not immediately transition from low to high on the falling edge of the precharge signal. Rather, the evaluation signal transitions from low to high after the evaluation delay.

The evaluation delay is a timing feature of the evaluation signal. One purpose of the evaluation delay is to ensure that there are no transient voltages on the bitlines after the precharge signal transitions from high to low. Moreover, it is desired to have settled current in sense amplifier branches. Hence, after the precharge phase, delay is added to generate the evaluation phase. Otherwise, data can be incorrectly read if the current margins between two sense amplifier branches are small. Thus, the evaluation delay has a value selected, in part, to ensure that transient effects are sufficiently dissipated from the bitlines. Read operations may depend, in part, on the evaluation delay having a value that falls within a selected tolerance. In the example of FIG. 3, the evaluation delay has a value of about 2.5 ns. The selected tolerance range for the evaluation delay is, in one embodiment, 2.5 ns±0.5 ns.

The read signals shown in FIG. 3 are given by way of example. Many other signal configurations and timing schemes can be utilized to read data from memory cells. The principles of measuring and trimming very short signal features disclosed herein can be used to measure and trim features of timing signals in other signal configurations and timing schemes without departing from the scope of the present disclosure, as will be understood by those of skill in the art in light of the present disclosure.

Figure 4:
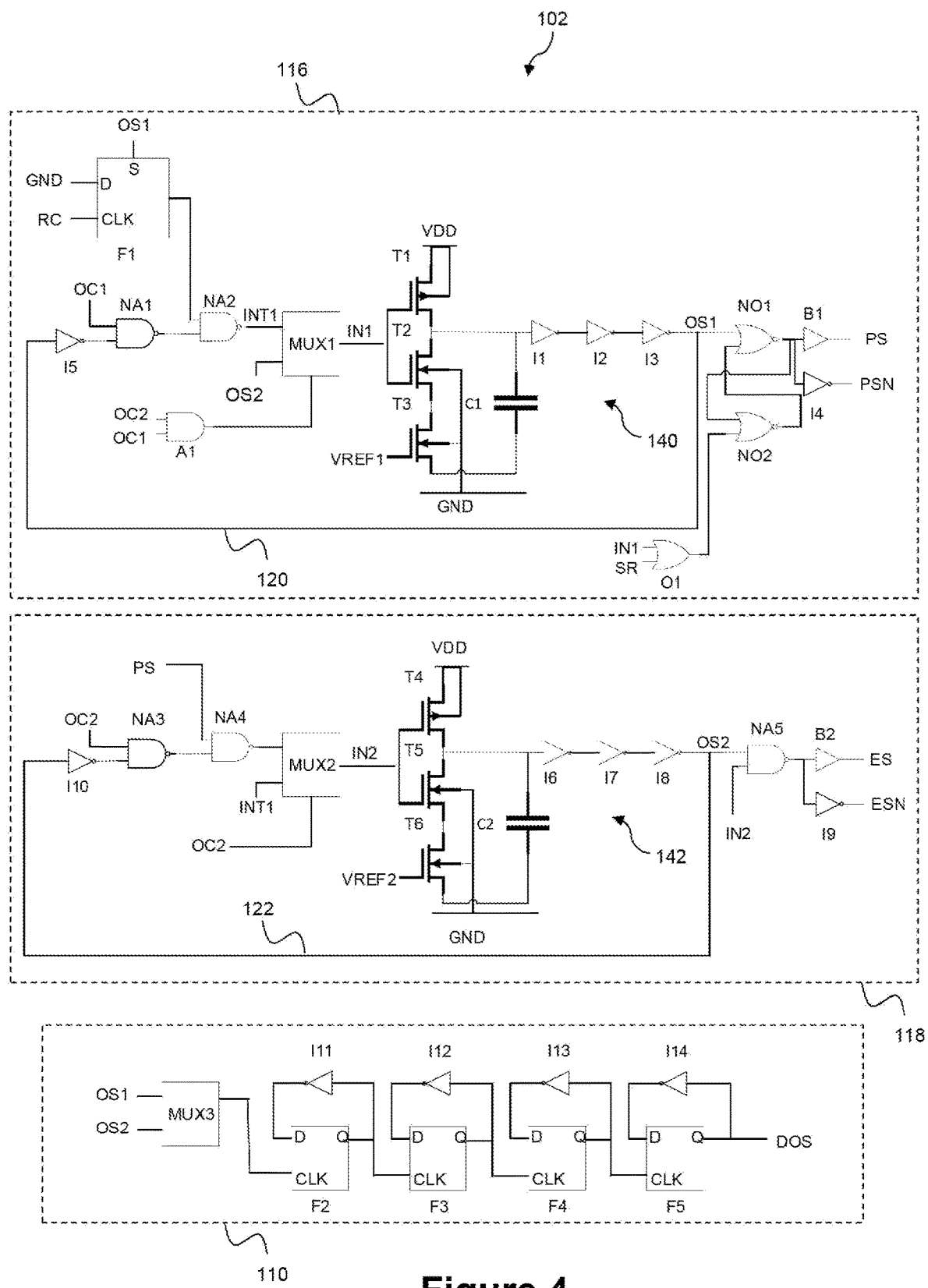
FIG. 4 is a schematic diagram of electronic circuitry included in an integrated circuit, according to one embodiment.

FIG. 4 is a schematic diagram of electronic circuitry included in the integrated circuit 102, according to one embodiment. The electronic circuitry includes the frequency divider 110, the precharge signal generator 116, and the evaluation signal generator 118, according to one embodiment. The precharge signal generator 116 and the evaluation signal generator 118 are part of the read signal generator 108 (not labeled in FIG. 4).

In one embodiment, the precharge signal generator 116 generates the precharge signal PS and its logical complement PSN. The evaluation signal generator 118 generates an evaluation signal ES and its logical complement ESN. During read operations of the memory array 106, the precharge signal, the evaluation signal, and their logical compliments are each provided to the sense amplifiers 107.

In one embodiment, during testing, the precharge signal generator 116 and the evaluation signal generator 118 can be controlled to selectively output oscillating signals to the frequency divider 110. The precharge signal generator 116 generates the oscillating signal OS1. The evaluation signal generator 118 generates the oscillating signal OS2. The oscillating signal OS1 has a frequency that corresponds to the precharge delay. The oscillating signal OS2 has a frequency that corresponds to the sum of the precharge delay and the evaluation delay.

The functions of the precharge signal generator 116 and the evaluation signal generator 118 are based, primarily, on two oscillator control signals OC1 and OC2. When OC1 and OC2 are both 0, or low logic value, the precharge signal generator 116 and the evaluation signal generator 118 are in a standard operating mode in which they generate the precharge signal PS and the evaluation signal ES for read operations. When the first oscillator control signal is 1 and the second oscillator control signal is 0, the oscillating signal OS1 is generated for testing purposes. When the first and second oscillator control signals OC1 and OC2 are 1, the oscillating signal OS2 is generated for testing purposes.

The precharge signal generator 116 includes a first flip-flop F1, five inverters I1-I5, a buffer B1, an AND gate A1, NAND gates NA1 and NA2, an OR gate O1, NOR gates NO1 and NO2, a multiplexer MUX1, a PMOS transistor T1, NMOS transistors T2 and T3, and a delay capacitor C1. These components cooperate together to provide the precharge signal PS and its logical complement PSN during read operations of the memory array 106, and to selectively output the oscillating signal OS1 during testing. Those of skill in the art will recognize, in light of the present disclosure, that the precharge signaling generator 116 can include additional components or different configurations of components, without departing from the scope of the present disclosure.

The flip-flop F1 receives ground GND and the read clock signal RC. The flip-flop F1 also receives the precharge signal PS on the "set" input. The output of the flip-flop F1 is provided to an input terminal of the NAND gate NA2. The second input of the NAND gate NA2 receives the output of the NAND gate NA1. The NAND gate NA2 outputs the signal INT1 to the multiplexer MUX1.

The multiplexer MUX1 receives as a second input, the signal OS2 from the evaluation signal generator 118. The multiplexer MUX1 receives as a control input, the second oscillator control signal OC2 from the output of the AND gate A1. The multiplexer MUX1 outputs either INT1 or OS2 as IN1 based on the value of the second oscillator control signal OC2. The purpose of the second oscillator control signal OC2 is described in further detail below.

IN1 is provided to the control gates of the PMOS transistor T1 and the NMOS transistor T2. If IN1 is high, then T1 is disabled, T2 is enabled, and the top terminal of the delay capacitor is coupled to GND. If In1 is low, then T2 is disabled, T1 is enabled, and the top terminal of the delay capacitor C1 is coupled to VDD.

The signal from the top terminal of the delay capacitor C1 is passed through the inverters I1-I3, the NOR gate NO1, and the buffer B1. The output of the buffer B1 is the precharge signal PS shown in FIG. 3. The input of the buffer B1 is provided to the input of the inverter I4. The inverter I4 outputs the logical complement PSN of the precharge signal PS.

The input of the buffer B1 is coupled to a first input of the NOR gate NO2. The second input of the NOR gate NO2 is coupled to the output of the OR gate O1. The output of the NOR gate NO2 is provided to a second input of the NOR gate NO1.

The OR gate O1 receives IN1 on a first input. The OR gate O1 receives the stop read signal SR on a second input. When the stop read signal SR goes high, the precharge signal is forced to go high via the NOR gates NO1 and NO2.

The precharge signal generator 116 includes delay circuitry 140. The delay circuitry 140 includes the delay capacitor C1 and the inverters I1-I3. The delay capacitor C1 is primarily responsible for the precharge delay. In the example in which the precharge delay is intended to be about eight seconds, the delay capacitor C1 provides a delay of about 6.5 ns. The delay provided by the capacitor C1 can be selectively modified. The inverters I1-I3 provide a delay of about 1.5 ns. The total precharge delay is about 8 ns. In practice, the total precharge delay is slightly more than the sum of the delays introduced by the delay capacitor C1 and the inverters I1-I3. This is because the other circuit components involved in the generation of the precharge signal introduce a very small amount of delay.

As described previously, it is possible that due to process variations in the fabrication of the integrated circuit, the delay introduced by the delay circuitry 140 will be slightly more or less than the intended value. If the total delay falls outside a selected tolerance range, then the precharge delay may need to be adjusted. The precharge signal generator 116 advantageously allows for trimming the precharge delay during testing.

The delay capacitor C1 provides an adjustable signal delay. The signal delay provided by the delay capacitor C1 is based on the value of the capacitance of the delay capacitor C1 and the current that discharges the capacitor C1. The value of this discharge current is determined by the transistors T2 and T3. The value of the current flowing in the transistors is controlled by the first reference voltage VREF1 applied to the gate of the transistor T3. A higher value of VREF1 will increase the current flow through the transistors T2 and T3, thereby decreasing the time required to discharge the delay capacitor C1. A lower value of VREF1 will decrease the current flow through the transistors T2 and T3, thereby increasing the time required to discharge the delay capacitor C1.

Accordingly, if testing indicates that the precharge delay is too short or too long, the precharge delay can be adjusted by adjusting the value of the reference voltage VREF1. To increase the precharge delay, the value of VREF1 can be reduced. To decrease the precharge delay, the value of VREF1 can be increased. The testing circuit 104 can provide control signals to adjust the value of VREF1.

When the value of IN1 transitions from high to low, the NMOS transistor T2 is disabled and the PMOS transistor T1 is enabled. The top terminal of the delay capacitor C1 is quickly charged to the supply voltage value VDD. When the value of IN1 transitions from low to high, the PMOS transistor T1 is disabled and the NMOS transistor T2 is enabled. The top terminal of the delay capacitor C1 is discharged to ground through the NMOS transistors T2 and T3. The discharge of C1 is much slower than the charging of C1 because the reference voltage VREF1 enforces a discharge current that is smaller than the charge current.

The evaluation signal generator 118 includes NAND gates NA3-NA5, inverters I6-I10, a buffer B2, the multiplexer MUX2, PMOS transistor T4, NMOS transistors N5 and N6, and a delay capacitor C2. When OC2 is set to 0, the evaluation signal generator 118 generates the evaluation signal ES and its logical complement ESN, as shown in FIG. 3.

The NAND gate NA3 receives the oscillator control signal OC2 on a first input, and the output of the inverter I10 on a second input. The output of NA3 is provided to a second input of the NAND gate NA4. NA4 receives the precharge signal PS on its first input. The precharge signal PS and the oscillator control signal OC2 primarily control the function of the evaluation signal generator 118.

A first input of the MUX2 receives the output of the NAND gate NA4. A second input of the multiplexer MUX2 receives the signal INT1 from the precharge signal generator 116. The multiplexer MUX2 receives the oscillator control signal OC2 on its control input. The multiplexer MUX2 outputs the signal IN2 to the gates of the transistors T4 and T5. The transistors T4-T6 and the delay capacitor C2 behave in substantially the same way as the transistors T1-T3 and the delay capacitor C1 as described in relation to the precharge signal generator 116, except that the delay capacitor C2 provides a smaller delay than the delay capacitor C1. Additionally, the gate of the transistor T7 receives a second reference voltage VREF2.

The output of the drain terminals of the transistors T4 and T5 is passed through the inverters I6-I8 to a first input of the NAND gate NA5. A second input of the NAND gate NA5 receives the signal IN2. The output of the NAND gate NA5 is provided to the buffer B2 and the inverter I9. The buffer B2 outputs the evaluation signal ES as shown in FIG. 3. The inverter I9 outputs the logical complement ESN of the evaluation signal ES.

The evaluation signal generator 118 includes delay circuitry 142. The delay circuitry 142 includes the delay capacitor C2 and the inverters I6-I8. In the example in which the evaluation delay is intended to be about 2.5 ns, the second delay capacitor C2 provides a delay of about 2 ns. The delay provided by the delay capacitor C2 can be selectively modified. The inverters I6-I8 provide a delay of about 0.5 ns. The evaluation delay can be adjusted by adjusting the value of the reference voltage VREF2 in the same manner as the precharge delay can be adjusted by adjusting VREF1, as described above.

During testing of the evaluation delay, the oscillator control signals OC1 and OC2 are set to 1. This enables the oscillator loop 122. In this case, the evaluation signal generator generates the oscillating signal OS2. The oscillating signal OS2 has a period that is approximately the sum of the precharge delay and the evaluation delay. When the oscillator loop 122 is enabled, the oscillating signal OS2 is passed through the inverter I10 and the NAND gate NA3. Because the multiplexer MUX2 receives INT1 from the precharge signal generator INT1, the oscillator loop 122 includes the oscillator loop 120 before returning to the output of the inverter I8. The result is that the oscillating signal OS2 includes the precharge delay and the evaluation delay. Thus, the oscillating signal OS2 has a period that is approximately the sum of the precharge delay and the evaluation delay.

While FIG. 4 illustrates an embodiment in which the evaluation delay is tested by joining the precharge delay in an oscillator loop, the evaluation delay can be tested separately in other embodiments. The oscillator loop 122 can be configured so that the precharge delay loop is not included in the oscillator loop 122. In this case, the oscillating signal OS2 can have a period that is approximately equivalent to the evaluation delay. However, because the evaluation delay is relatively short, it can be advantageous to measure the evaluation delay indirectly by subtracting the measured precharge delay from the measured sum of the precharge and evaluation delays.

The frequency divider 110 includes flip-flops F2-F5, inverters I11-I14, and multiplexer M3. The flip-flops F2-F5 and the inverters I11-I14 are coupled together in a frequency divider configuration. The multiplexer MUX3 receives the oscillating signals OS1 and OS2. The output of the multiplexer MUX3 is provided to the input of the flip-flop F2. When an oscillating signal OS1 or OS2 is provided from the output of the multiplexer MUX3 to the input of the flip-flop F2, the flip-flop F5 outputs a divided oscillating signal DOS. The divided oscillating signal DOS has a frequency that corresponds to the frequency of the oscillating signal divided by a division ratio N. In the example of FIG. 4, the frequency divider has a division ratio of 16. The frequency divider 110 can have a division ratio other than 16 in other embodiments.

Figure 5:
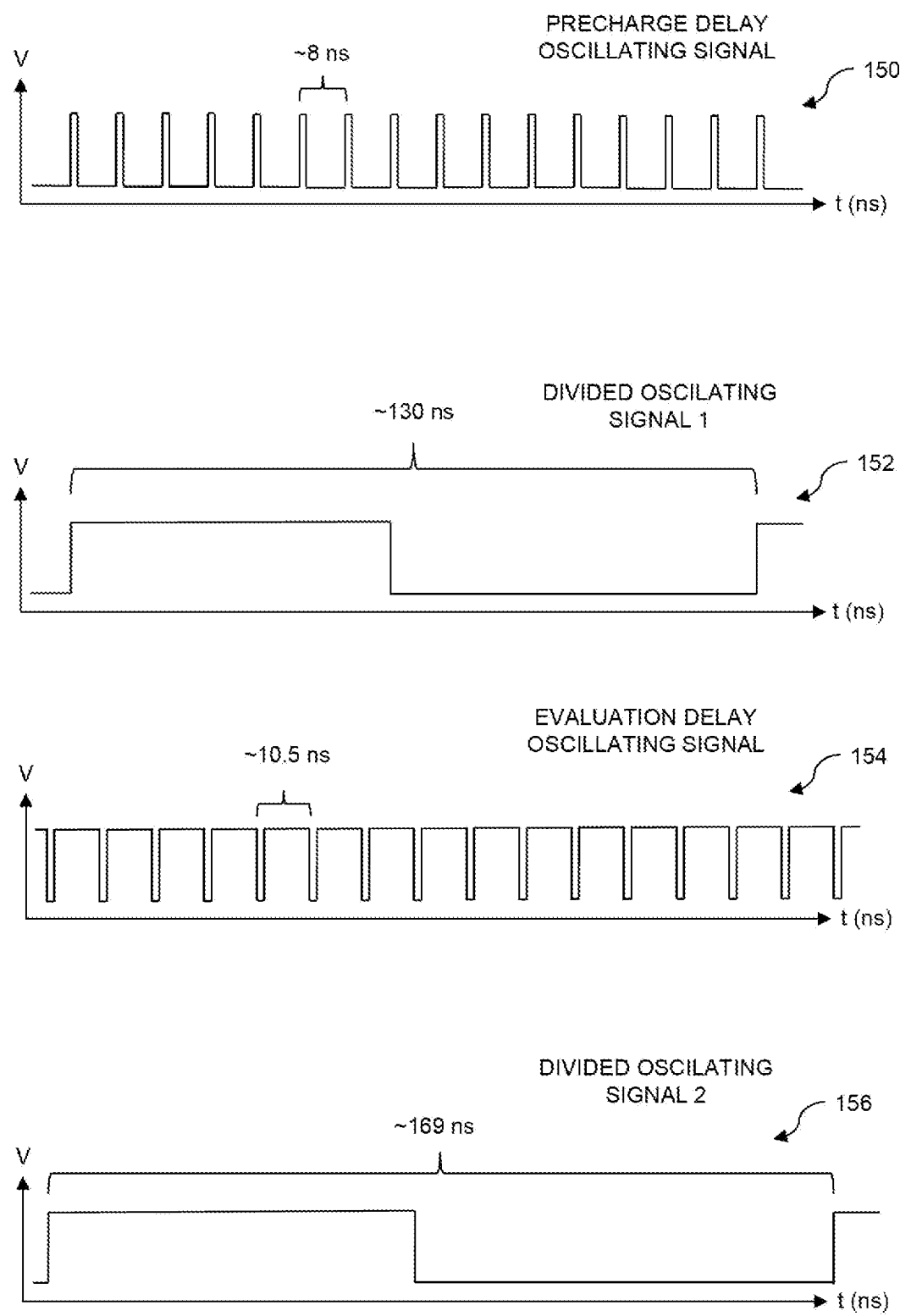
FIG. 5 illustrates a plurality of graphs of various oscillating signals, according to one embodiment.

FIG. 5 illustrates a plurality of graphs including a graph 150 of the first oscillating signal, a graph 152 of the first divided oscillating signal, a graph 154 of the second oscillating signal, and a graph 156 of the second divided oscillating signal.

With reference to FIG. 4 and FIG. 5, during testing of the precharge delay, OC1 is set to 1, OC2 is set to 0, and the precharge signal generator 116 generates the first oscillating signal OS1, as shown in the graph 150 of FIG. 5. The first oscillating signal OS1 has a period of about 8 ns and a frequency of about 123 MHz. When OS1 is provided to the frequency divider 110, the frequency divider generates a first divided oscillating signal DOS having a frequency of about 7.7 MHz and a period of about 130 nanoseconds, as shown in the graph 152 of FIG. 5. The period of about 130 ns is sufficient that one of the I/O pads 112 can be charged or discharged so that the frequency and period of the divided oscillating signal can be properly measured. The value of the precharge delay can then be calculated by dividing the period of the first divided oscillating signal by the division factor of 16.

If the precharge delay is calculated to have a value outside the tolerance range, then the precharge delay can be adjusted or trimmed as described above. The testing circuit 104 can adjust VREF1 so that the delay capacitor C1 discharges more quickly or less quickly, as needed. The precharge delay can then be tested again and VREF1 can be adjusted again until the precharge delay falls within the selected tolerance range.

During testing of the evaluation delay, OC1 and OC2 are both set to 1 and the evaluation signal generator 118 generates the second oscillating signal OS2, as shown in FIG. 5. With reference to FIG. 5, the second oscillating signal OS2 has a period of about 10.5 ns and a frequency of about 95 MHz. When OS2 is provided to the frequency divider 110, the frequency divider 110 generates a second divided oscillating signal DOS having a frequency of about 6 MHz and a period of about 169 ns. The period of about 169 ns is sufficient that one of the I/O pads 112 can be charged or discharged such that the frequency and period of the second divided oscillating signal can be properly measured. The value of the sum of the evaluation and precharge delays can then be calculated by dividing the period of the divided oscillating signal by the division factor of 16. The value of the evaluation delay can then be calculated by subtracting the previously calculated precharge delay from the calculated sum of the precharge and evaluation delays. This calculation gives an evaluation delay of about 2.5 ns.

If the evaluation delay is calculated to have a value outside a selected tolerance range, then the evaluation delay can be adjusted or trimmed as described above. The testing circuit 104 can adjust VREF2 so that the delay capacitor C2 discharges more quickly or less quickly, as needed. The evaluation delay can then be tested again and VREF2 can be adjusted again until the evaluation delay falls within the selected tolerance range.

Figure 6:
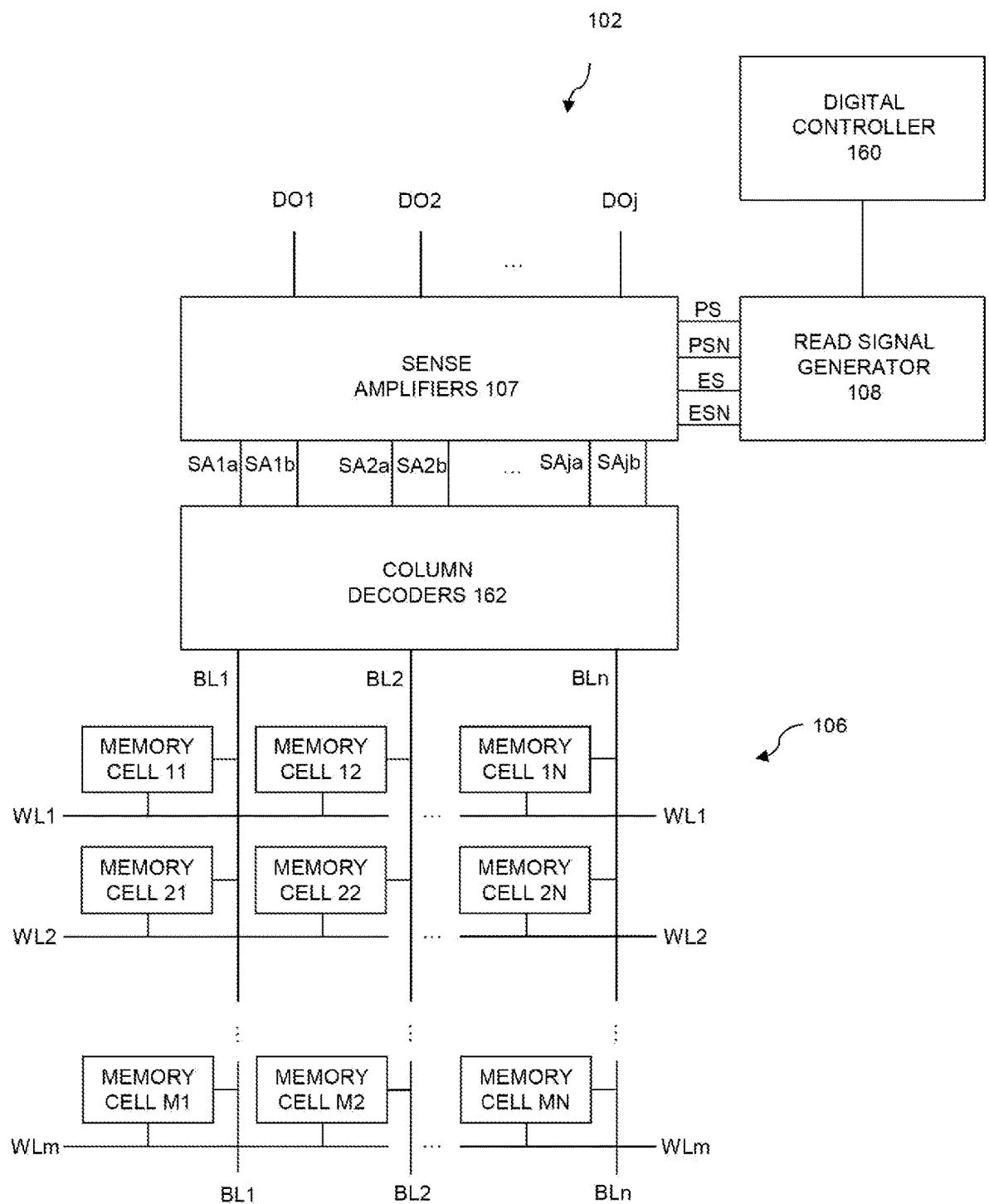
FIG. 6 is a block diagram of an integrated circuit, according to one embodiment.

FIG. 6 is a block diagram of an integrated circuit 102, according to one embodiment. The integrated circuit 102 includes a digital controller 160, a read signal generator 108, sense amplifiers 107, column decoders 162, and a memory array 106.

The memory array 106 includes a plurality of memory cells arranged in m rows and n columns. The memory array 106 includes a plurality of bitlines BL1-BLn, one bitline for each column. Each bitline is coupled to or connected to the memory cells in the corresponding column. The memory array 106 includes a plurality of wordlines WL1-WLm, one wordline for each column. Each wordline is coupled to the memory cells in the corresponding row.

The bitlines BL1-Bln are coupled to the column decoders 162. The column decoders 162 are coupled to the sense amplifiers 107. There are j sense amplifiers. Each sense amplifier is coupled to the column decoders 162 by two sense lines. For example, a first sense amplifier is coupled to sense lines SA1a, SA1b. The jth sense amplifier is coupled to sense lines SAja, SAjb. During a read operation, the column decoders connect each sense amplifier to one of the bitlines, in accordance with memory addresses to be read. The sense amplifiers 107 precharge the bitline and evaluate the data from the bitline via the sense lines SA. The sense amplifiers 107 output the data values read from the memory cells via data output lines DO1-DOj.

The read signal generator 108 supplies read signals to the sense amplifiers 107. In particular, the read signal generator 108 outputs to each sense amplifier the precharge signal PS, the complementary precharge signal PSN, the evaluation signal ES, and the complementary precharge signal ESN. The read signals control the operations of the sense amplifiers 107.

The digital controller 160 controls the read signal generator 108. When data is to be read from the memory array 106, the digital controller 160 controls the read signal generator 108 to generate the read signals. Though not shown, the digital controller 160 can also control column decoders 162 and can provide memory addresses to the column decoders 162. The integrated circuit may also include row decoders for selecting wordlines for read operations, under control of the digital controller 160.

Though not shown in FIG. 6, the memory array can include access transistors that couple the memory cells to the wordlines. The memory array can also include access transistors that couple the memory cells to the bitlines.

In one embodiment, the memory cells can include phase change memory cells. Each phase change memory cell includes a material whose phase, such as an amorphous phase or a crystalline phase, indicates the value of data stored therein. Data is written to the phase change memory cell by changing the phase of the material.

In one embodiment, the memory cells include read only memory cells, flash memory cells, magnetoresistive random access memory cells (MRAM), or other types of nonvolatile memory cells.

The memory cells can include volatile memory cells that need continuous or intermittent refreshing in order to retain stored data. The volatile memory cells can include dynamic random-access memory (DRAM), static random-access memory (SRAM), or other types of volatile memory cells.

FIG. 7 is a flow diagram of a process 700, according to an embodiment. At 702, a first oscillating signal is generated with a read signal generator of an integrated circuit. At 704, a first divided oscillating signal is generated from the first oscillating signal with a frequency divider of the integrated circuit. At 706, the first divided oscillating signal is output on an output pad of the integrated circuit.

The various embodiments described above can be combined to provide further embodiments. All U.S. patent application publications and U.S. patent applications referred to in this specification and/or listed in the Application Data Sheet are incorporated herein by reference, in their entirety. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
an array of memory cells;
a plurality of bit lines coupled to the array of memory cells; and
a read signal generator including:
a precharge signal generator including an input and an output and configured to generate a precharge signal including a precharge delay for timing precharging of the bitlines;
an evaluation signal generator including an input coupled to the output of the precharge signal generator and configured to generate an evaluation signal for evaluating data values stored in the memory cells during a read operation of the memory cells, the evaluation signal including an evaluation delay for timing evaluation of the data values; and
at least one switch configured to selectively cause the read signal generator to generate an oscillating signal to enable testing of at least one of the precharge delay and the evaluation delay.

2. The device of claim 1, wherein the at least one switch is configured to selectively connect an output of the precharge signal generator to an input of the precharge signal generator, wherein the read signal generator is configured to close the at least one switch to enable testing of the precharge delay.

3. The device of claim 2, comprising a frequency divider having an input coupled to an output of the read signal generator, wherein during testing of the precharge delay, the frequency divider receives the oscillating signal from the read signal generator and generates a divided oscillating signal by dividing a frequency of the oscillating signal; and
an I/O pad coupled to an output of the frequency divider, and configured to receive the divided oscillating signal from the frequency divider during testing of the precharge delay.

4. The device of claim 1, wherein the at least one switch is configured to selectively connect an output of the evaluation signal generator to an input of the evaluation signal generator, wherein the read signal generator is configured to close the at least one switch to enable testing of the evaluation delay.

5. The device of claim 4, comprising a frequency divider having an input coupled to an output of the read signal generator, wherein during testing of the evaluation delay, the frequency divider receives the oscillating signal from the read signal generator and generates a divided oscillating signal by dividing a frequency of the oscillating signal; and
an I/O pad coupled to an output of the frequency divider, and configured to receive the divided oscillating signal from the frequency divider during testing of the evaluation delay.

6. The device of claim 1, wherein the at least one switch is configured to selectively connect an output of the evaluation signal generator to an input of the precharge signal generator, wherein the read signal generator is configured to close the at least one switch to enable testing of a sum of the precharge delay and the evaluation delay.

7. The device of claim 6, comprising a frequency divider having an input coupled to an output of the read signal generator, wherein during testing of the sum of the precharge delay and the evaluation delay, the frequency divider receives the oscillating signal from the read signal generator and generates a divided oscillating signal by dividing a frequency of the oscillating signal; and
an I/O pad coupled to an output of the frequency divider, and configured to receive the divided oscillating signal from the frequency divider during testing of the sum of the precharge delay and the evaluation delay.

8. The device of claim 1, wherein the at least one switch includes
a first switch configured to selectively connect the output of the precharge signal to the input of the precharge signal generator;
a second switch configured to selectively connect an output of the evaluation signal generator to the input of the evaluation signal generator; and
a third switch configured to selectively connect the output of the evaluation signal generator to the input of the evaluation signal generator.

9. The device of claim 8, wherein the read signal generator is configured to open the second switch and the third switch and to close the first switch to enable testing of the precharge delay.

10. The device of claim 9, wherein the read signal generator is configured to open the first switch and the third switch and to close the second switch to enable testing of the evaluation delay.

11. The device of claim 10, wherein the read signal generator is configured to open the first switch and the second switch and to close the third switch to enable testing of a sum of the precharge delay and the evaluation delay.

12. A method, comprising:
coupling a test circuit to an integrated circuit that includes a memory array and a read signal generator configured to generate a read control signal that controls a read operation of the memory cells;
outputting, from the test circuit, an oscillator control signal that causes the read signal generator generate an oscillating signal having a first frequency based on a feature of the read signal;
receiving, with the test circuit from the integrated circuit, a divided oscillating signal having a second frequency based on the first frequency; and
measuring, with the test circuit, the feature of the read signal based on the divided oscillating signal.

13. The method of claim 12, comprising outputting a control signal from the test circuit to the integrated circuit causing the integrated circuit to adjust the feature of the read signal after measuring the feature of the read signal.

14. The method of claim 12, wherein the feature is a delay in a transition of the read signal.

15. The method of claim 14, wherein the oscillating signal has a period approximately equal to the delay.

16. The method of claim 14, wherein the first frequency is based on the delay.

17. The method of claim 14, wherein measuring the feature includes:
measuring the second frequency; and
computing the first frequency based on the second frequency and a division ratio.

18. A device, comprising:
an array of memory cells;
a plurality of bit lines coupled to the array of memory cells; and
a read signal generator including a precharge signal generator having a logic gate configured to receive a control signal and to selectively cause the precharge signal generator to operate in a standard mode or in a testing mode based on a value of the control signal, wherein in the standard mode the precharge signal generator generates a precharge signal for timing precharging of the bitlines, wherein in the testing mode the precharge signal generator outputs an oscillating signal.

19. The device of claim 18, wherein the oscillating signal has a frequency based on a delay value of the precharge signal.

20. The device of claim 18, comprising a frequency divider coupled to the precharge signal generator and configured to receive the oscillating signal and to generate a divided oscillating signal.

* * * * *